(12) United States Patent
Sanada et al.

(10) Patent No.: US 10,552,700 B2
(45) Date of Patent: Feb. 4, 2020

(54) MAGNETIC INK READER AND PRINTER HAVING THE SAME

(71) Applicant: TOSHIBA TEC KABUSHIKI KAISHA, Tokyo (JP)

(72) Inventors: Tsuyoshi Sanada, Susono Shizuoka (JP); Yuji Kawamorita, Mishima Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/402,702

(22) Filed: May 3, 2019

(65) Prior Publication Data

US 2019/0258884 A1   Aug. 22, 2019

Related U.S. Application Data

(63) Continuation of application No. 16/122,594, filed on Sep. 5, 2018, now Pat. No. 10,325,170.

(30) Foreign Application Priority Data

Sep. 7, 2017   (JP) .................................. 2017-172308

(51) Int. Cl.

| | |
|---|---|
| *G06K 9/18* | (2006.01) |
| *G06K 1/12* | (2006.01) |
| *B41J 15/04* | (2006.01) |
| *G01R 33/12* | (2006.01) |
| *G06K 7/08* | (2006.01) |
| *B41J 3/50* | (2006.01) |
| *G01R 33/02* | (2006.01) |
| *H01F 1/12* | (2006.01) |

(52) U.S. Cl.
CPC ............... *G06K 9/186* (2013.01); *B41J 3/50* (2013.01); *B41J 15/048* (2013.01); *G01R 33/02* (2013.01); *G01R 33/12* (2013.01); *G06K 1/125* (2013.01); *G06K 7/084* (2013.01); *H01F 1/12* (2013.01)

(58) Field of Classification Search
CPC ........ G06K 9/186; G06K 1/125; B41J 15/048
USPC ....................................................... 235/449
See application file for complete search history.

(56) References Cited

U.S. PATENT DOCUMENTS 5,414,783 A  *  5/1995  Bov, Jr. .................. G06K 7/084
                                                          235/450
2018/0264801 A1   9/2018  Fukumoto et al.

FOREIGN PATENT DOCUMENTS

| CN | 1966278 A | 5/2007 |
|---|---|---|
| JP | 2001-283401 A | 10/2001 |
| JP | 2004-206316 A | 7/2004 |

* cited by examiner

*Primary Examiner* — Toan C Ly
(74) *Attorney, Agent, or Firm* — Kim & Stewart LLP

(57) ABSTRACT

A magnetic ink reader includes a conveyance mechanism for a sheet, a magnetizing mechanism configured to magnetize magnetic ink on the sheet and including a magnet having a first side of a first magnetic polarity, that is arranged to face a first surface of the sheet, and a yoke that is formed of a soft magnetic material and includes a base portion attached directly to a second side of the magnet, and an extension portion extending from the base portion such that an end surface of the extension portion faces a second surface of the sheet, and a magnetic detection head along the conveyance path and configured to detect magnetism of the magnetized magnetic ink on the sheet. A first distance between the conveyance path and the first side of the magnet is less than a second distance between the conveyance path and the end surface of the yoke.

20 Claims, 3 Drawing Sheets

MAGNETIC INK READER AND PRINTER HAVING THE SAME

CROSS-REFERENCE TO RELATED APPLICATION

This application is a continuation of U.S. patent application Ser. No. 16/122,594, filed Sep. 5, 2018, which application is based upon and claims the benefit of priority from Japanese Patent Application No. 2017-172308, filed Sep. 7, 2017, the entire contents of which are incorporated herein by reference.

FIELD

Embodiments described herein relate to a magnetic ink reader that reads magnetic ink characters and a printer having the same.

BACKGROUND

Magnetic ink character recognition (MICR) characters may be printed on a front surface of a medium such as a bill or a check. Such MICR characters are read by a magnetic ink reader as follows. When the medium is inserted into the reader, a magnet magnetizes the MICR characters. Then, an MICR head, which is magnetic detection head, detects a residual magnetic field generated by residual magnetism of the MICR characters, and identifies the MICR characters from a magnetic property or a magnetic pattern of the detected magnetic field. From the MICR characters, bills and checks can be distinguished.

Such a magnetic ink reader is incorporated in an ATM or a POS printer 100 as illustrated in FIG. 1, for example. In FIG. 1, P represents a sheet-like medium such as a bill or a check, and K represents a conveyance path of the medium P. FIG. 2 illustrates an example of the medium P. The medium P includes a sheet-like medium body Pa. Characters Pb and MICR characters Pc are printed on the medium body Pa by normal ink and magnetic ink, respectively.

In the printer 100, a magnet 101, an MICR head 102, a feed roller 103 and a pinch roller 104, and an inkjet head 105 and a platen 106 are arranged along the conveyance path K from the left side in FIG. 1. In addition, the printer 100 is provided with a motor 110 configured to drive the feed roller 103 and a gear mechanism 111 configured to transmit torque of the motor 110.

As the magnet 101, a powerful permanent magnet is used to stably magnetize the MICR character Pc. The magnetic field of the magnet 101 has such a property that lines of magnetic force generated from an N pole cause the side surface of the magnet to turn around and become an S pole. Therefore, the magnetic force is the strongest near the magnet 101. Further, the magnet 101 and the MICR head 102 are provided corresponding to the position of the MICR character Pc of the medium P to be conveyed on the conveyance path K.

The printer 100 performs reading by magnetizing the MICR character Pc and detecting the residual magnetic field. In such a printer 100, since reading the MICR character Pc is required to be accurate, magnetization is also required to be performed accurately.

In order to stably magnetize the MICR character Pc, the MICR character Pc is passed in the vicinity of the magnet 101 to magnetize the MICR character with a powerful magnetic force. Since the magnetic force of the magnetic field varies greatly depending on position, the relative position between the MICR character Pc and the magnet 101 needs to be adjusted with high accuracy.

However, since the motor 110 configured to convey the medium P is in the vicinity of the magnet 101, vibration of the motor 110 may be transmitted to the magnet 101 or the MICR head 102. When the vibration is transmitted to the magnet 101, the relative position between the magnet 101 and the MICR character Pc fluctuates, and a magnetizing force with respect to the MICR character Pc also sometimes fluctuates. Since the fluctuation of the magnetizing force appears as fluctuation in the magnetic property or the magnetic pattern to be detected by the MICR head 102, the fluctuation has an impact on reading accuracy.

The magnet 101 with a powerful magnetic force may be used to offset the fluctuation. However, since the distance between the magnet 101 and the MICR head 102 is about 4 to 5 cm, the magnetic force of the magnet 101 may affect the reading accuracy of the MICR head 102.

Therefore, there is a need for an apparatus which is capable of reading magnetic ink to be printed on a medium with high accuracy.

DETAILED DESCRIPTION

Embodiments provide a magnetic ink reader capable of performing stable magnetization of magnetic ink characters to be read, even in the presence of external disturbance such as vibration of a motor within a printer that employs such a magnetic ink reader.

In general, according to one embodiment, a magnetic ink reader includes a conveyance mechanism configured to convey a sheet-like medium along a conveyance path, a magnetizing mechanism configured to magnetize magnetic ink formed on the sheet-like medium conveyed thereto along the conveyance path and including a magnet having a first side of a first magnetic polarity, that is arranged to face a first surface of the sheet-like medium that is conveyed along the conveyance mechanism to the magnetizing mechanism, and a yoke that is formed of a soft magnetic material and includes a base portion attached directly to a second side of the magnet, which is opposite to the first side, and an extension portion extending from the base portion such that an end surface of the extension portion faces a second surface of the sheet-like medium, which is opposite to the first surface, and a magnetic detection head disposed along the conveyance path and configured to detect magnetism of the magnetized magnetic ink formed on the sheet-like medium. A first distance between the conveyance path and the first side of the magnet is less than a second distance between the conveyance path and the end surface of the yoke.

An embodiment will be described below with reference to the drawings.

Figure 1:
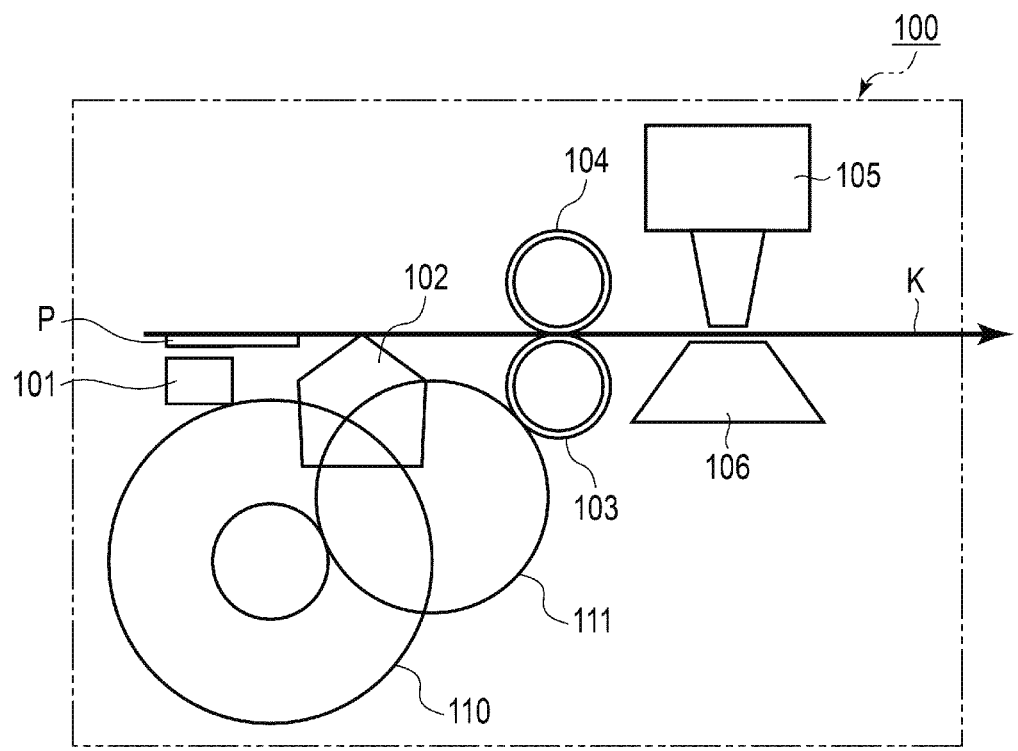
FIG. 1 is a diagram of a printer incorporating a conventional magnetic ink reader.
Figure 2:
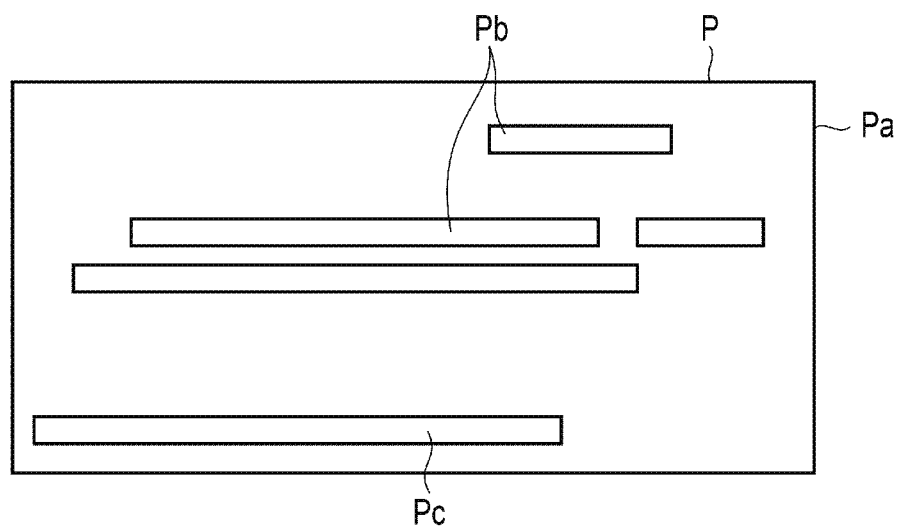
FIG. 2 is a plan view of a medium on which magnetic ink is printed.
Figure 3:
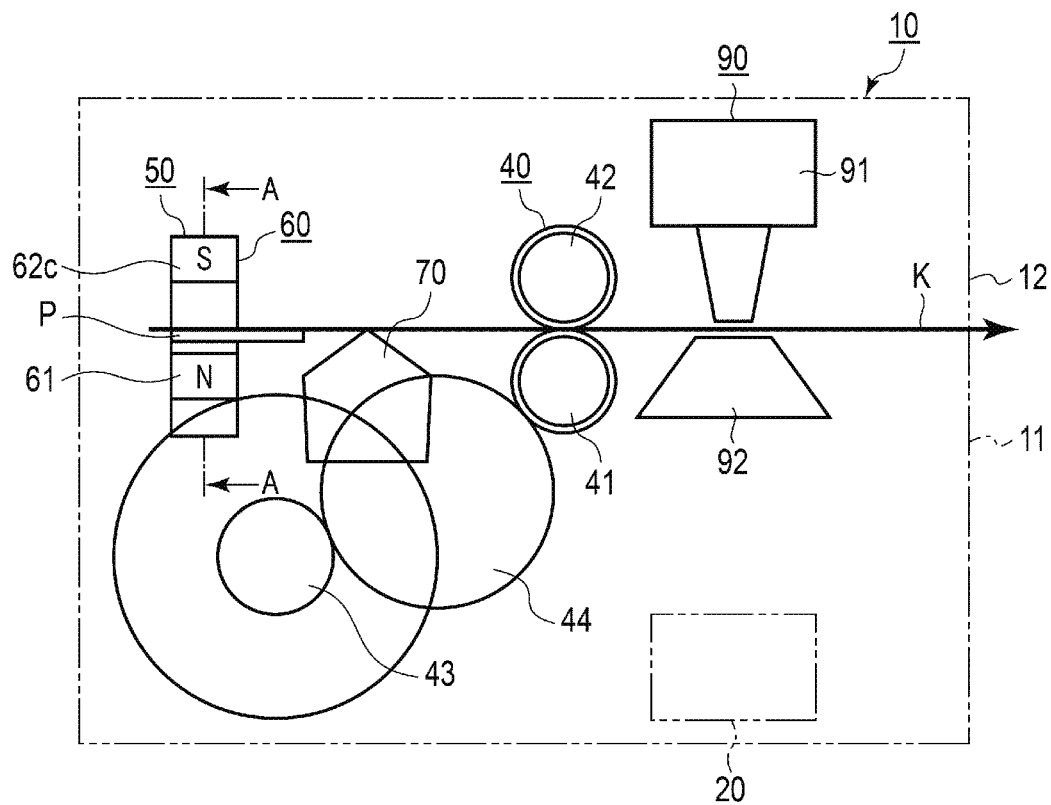
FIG. 3 is a diagram of a printer incorporating a magnetic ink reader according to an embodiment.

FIG. 3 is a diagram of a printer 10 incorporating a magnetic ink reader 50 according to the embodiment. The printer 10 is installed in an ATM of a bank or a POS (Point Of Sales) terminal of a store or a warehouse. In the drawings, P represents a sheet-like medium such as a bill, a check, or a gift certificate, and K represents a conveyance path of the medium P. As shown in FIG. 2, the medium P includes a sheet-like medium body Pa. Characters Pb and MICR characters Pc are printed on the medium body Pa by normal ink and magnetic ink, respectively. The printer 10 includes a housing 11. The conveyance path K is formed inside the housing 11. At a right end of the conveyance path K in FIG. 3, a slot 12 is provided through which the medium P is inserted from and ejected to the outside. When the printer 10 is used, a front surface of a medium on which magnetic ink is previously printed is inserted face down in FIG. 3.

The housing 11 accommodates a control unit 20 (e.g., a control circuit, a conveyance mechanism 40, a magnetic ink reader 50, and a printing mechanism 90 therein, and the printing mechanism 90 is provided closer to the slot 12 compared with the magnetic ink reader 50. The control unit 20 controls the conveyance mechanism 40, the magnetic ink reader 50, and the printing mechanism 90.

The conveyance mechanism 40 forms the conveyance path K, through which the sheet-like medium P printed with magnetic ink is conveyed, with a plurality of rollers including a feed roller 41 and a pinch roller 42. The conveyance mechanism 40 includes a motor 43 and a gear mechanism 44 configured to transmit torque of the motor 43 to each of the roller.

The magnetic ink reader 50 includes a magnetizing mechanism 60 to magnetize the magnetic ink of the medium P on the conveyance path K and an MICR head 70. The MICR head 70 is disposed at a downstream side of the conveyance path K of the magnetizing mechanism 60, about 4 to 5 cm away from the magnetizing mechanism 60. The MICR head 70 reads magnetism of the magnetized magnetic ink.

Figure 4:
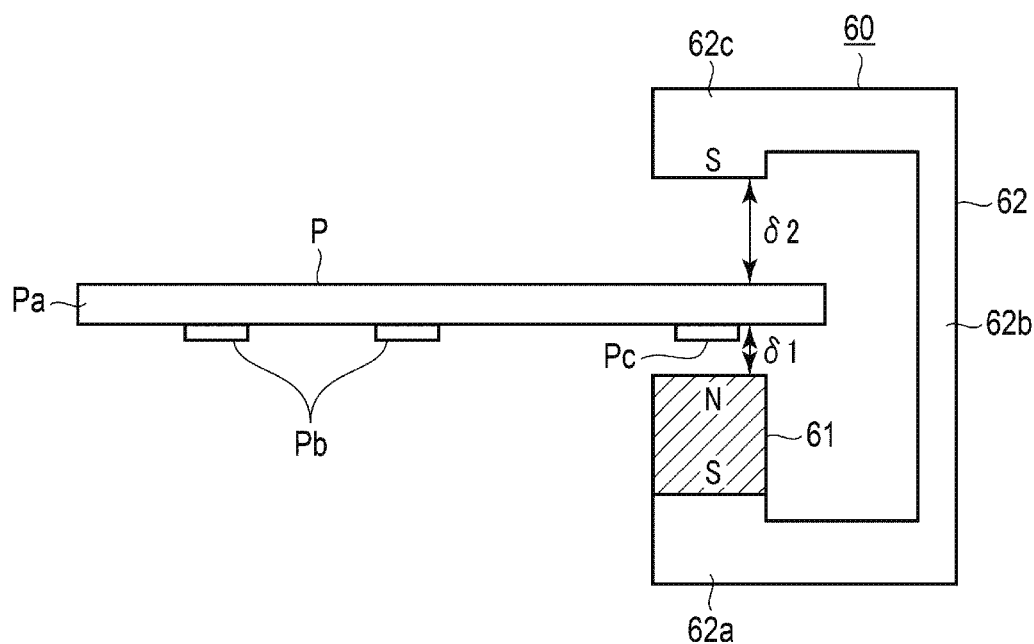
FIG. 4 is a cross-sectional view of a magnetizing mechanism incorporated in the magnetic ink reader according to the embodiment taken along line A-A in FIG. 3.

As illustrated in FIG. 4, the magnetizing mechanism 60 includes a magnet 61 in which one polar surface (e.g., an N pole surface) faces the front surface of the medium P. A yoke member 62 is L-shaped and is directly attached to the other polar surface (e.g., an S pole surface) of the magnet 61. The yoke member 62 is formed of a soft magnetic material, for example, electrogalvanized steel or permalloy which is inexpensive and suitable.

The yoke member 62 includes a base portion 62a attached to the S pole surface of the magnet 61, and an extension portion 62b that extends from the base portion 62a to the other surface side of the medium P while straddling the conveyance path K, and a facing portion 62c that faces an N pole of the magnet 61 so as to sandwich the medium P from the extension portion 62b. By the yoke member 62, an S pole is generated in the facing portion 62c.

A distance δ2 between a rear surface of the medium P and the facing portion 62c is formed to be larger than a distance δ1 between the front surface of the medium P and the N pole of the magnet 61.

Figure 5:
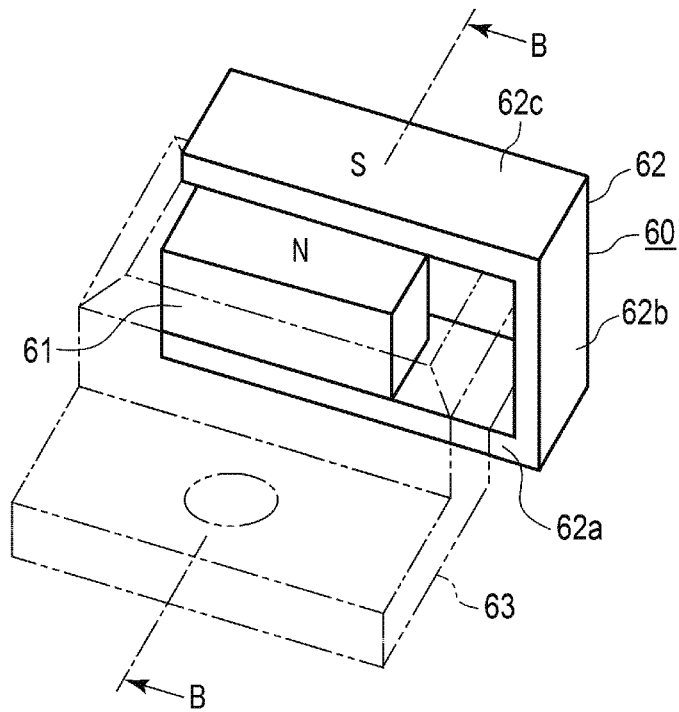
FIG. 5 is a perspective view illustrating the magnetizing mechanism of the embodiment.
Figure 6:
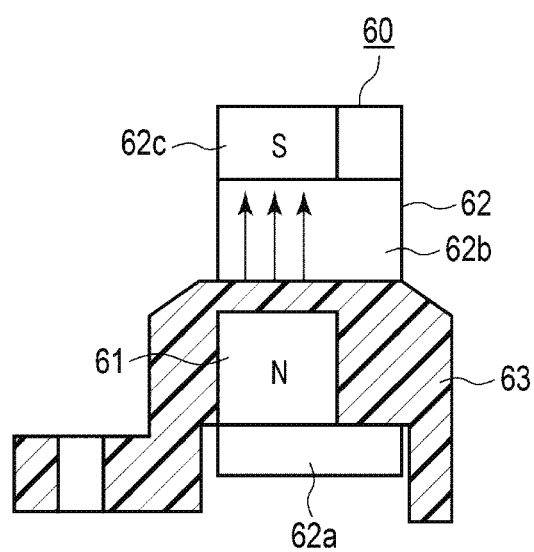
FIG. 6 is a cross-sectional view of the magnetizing mechanism of the embodiment taken along line B-B in FIG. 5.

FIG. 5 is a perspective view illustrating the magnetizing mechanism according to the embodiment, and FIG. 6 is a cross-sectional view of the magnetizing mechanism of the embodiment taken along line B-B in FIG. 5 as viewed in a direction indicated by an arrow.

As illustrated in FIGS. 5 and 6, at least a part of the magnet 61 and the yoke member 62 is formed with a resin material 63. The resin material 63 prevents the magnet 61 and the yoke member 62 from coming into contact with or closely contacting another metal member, and prevents another metal member from being magnetized. In addition, the resin material 63 prevents the medium. P from contacting the magnet 61, thereby preventing damage to the medium P, and also keeps the distance between the medium P and the N pole of the magnet 61 constant.

The MICR head 70 detects a residual magnetic force of the MICR character Pc. The detected residual magnetic force is read as a magnetic property or a magnetic pattern and is output as an electric signal to the control unit 20. By comparing the detected residual magnetic force with a magnetic property or a magnetic pattern of the MICR character Pc preset in the control unit 20, the MICR character Pc is identified.

The printing mechanism 90 includes an inkjet head 91 and a platen 92. The platen 92 is disposed so as to sandwich the conveyance path K with the inkjet head 91.

In the printer 10 described above, magnetic ink reading and printing are performed in the following manner. That is, the medium P is inserted through the slot 12 of the housing 11 such that the front surface printed with the MICR character Pc faces downward. The inserted medium P is conveyed toward a left side in FIG. 3 along the conveyance path K by the conveyance mechanism 40.

When the medium P reaches the magnetizing mechanism 60, the MICR character Pc passes through the magnetizing mechanism 60. At this time, the MICR character Pc is magnetized by the magnetic force of the magnet 61. Here, the magnetic field generated by the magnet 61 is directed from the N pole of the magnet 61 to the S pole of the facing portion 62c, and a very small magnetic field leaks to the outside of the magnetizing mechanism 60. Further, since the magnetic force is substantially constant between the N pole of the magnet 61 and the S pole of the facing portion 62c, even if the distance between the N pole of the magnet 61 and the MICR character Pc varies due to vibration caused by the motor 43, the residual magnetism of the MICR character Pc is substantially constant.

When the medium P is conveyed to a right side in FIG. 3 by the conveyance mechanism 40 and thus the MICR character Pc reaches the MICR head 70, the MICR head 70 detects the residual magnetic field generated by the residual magnetism of the MICR character Pc. From the magnetic property or the magnetic pattern of the residual magnetism, the MICR character Pc is identified.

Next, when the medium P is conveyed to the right side in FIG. 3 by the conveyance mechanism 40 and thus the medium P reaches the printing mechanism 90, the inkjet head 91 performs printing such as "used" or "invalid" according to the determination result of the medium P described above.

The medium P, on which the printing is completed, is ejected from the slot 12 of the housing 11 by the conveyance mechanism 40.

According to the printer 10 described above, even if the vibration occurs due to the external disturbance of the motor 43, the residual magnetism applied to the MICR character Pc does not fluctuate largely. That is, the magnetizing mechanism 60 can reliably apply the residual magnetism to the MICR character under the stable magnetic field. Therefore, the MICR head 70 can read the residual magnetism with high accuracy, and can minimize erroneous recognition or erroneous occurrence. In addition, since the yoke member 62 is directly attached to the magnet 61, the yoke member 62 can be formed of an inexpensive soft magnetic material.

While some embodiments of the present invention have been described, these embodiments are merely examples, and are not intended to limit the scope of the invention. These novel embodiments may be implemented in various other forms, and various omissions, replacements, and modifications may be made without departing from the scope and spirit of the invention. These embodiments and the modifications are included in the scope and spirit of the invention, and are included in the invention described in the claims and their equivalents.

What is claimed is:

1. A magnetic ink reader comprising:
   a conveyance mechanism configured to convey a sheet-like medium along a conveyance path;
   a magnetizing mechanism configured to magnetize magnetic ink formed on the sheet-like medium conveyed thereto along the conveyance path and including
      a magnet having a first side arranged to face a first surface of the sheet-like medium that is conveyed along the conveyance path to the magnetizing mechanism, and
      a yoke including a base portion attached to a second side of the magnet, which is opposite to the first side, and an extension portion extending from the base portion such that an end surface of the extension portion faces a second surface of the sheet-like medium, which is opposite to the first surface; and
   a magnetic detection head disposed along the conveyance path and configured to detect magnetism of the magnetized magnetic ink formed on the sheet-like medium, wherein
   a first distance between the conveyance path and the first side of the magnet is less than a second distance between the conveyance path and the end surface of the yoke.

2. The reader according to claim 1, wherein the first side of the magnet has a first magnetic polarity, and the end surface of the extension portion has a second magnetic polarity that is different from the first magnetic polarity.

3. The reader according to claim 1, wherein the yoke is formed of a soft magnetic material.

4. The reader according to claim 3, wherein the soft magnetic material is electrogalvanized steel.

5. The reader according to claim 3, wherein the soft magnetic material is permalloy.

6. The reader according to claim 1, wherein the base portion is attached directly to the second side of the magnet.

7. The reader according to claim 1, wherein at least a part of the yoke and the magnet is formed of a resin material.

8. The reader according to claim 1, wherein a portion of the extension portion of the yoke faces a side surface of the magnet in a direction that is perpendicular to a conveyance direction of the sheet-like medium.

9. A printer comprising:
   a conveyance mechanism configured to convey a sheet-like medium along a conveyance path;
   a magnetizing mechanism configured to magnetize magnetic ink formed on the sheet-like medium conveyed thereto along the conveyance path and including
      a magnet having a first side arranged to face a first surface of the sheet-like medium that is conveyed along the conveyance path to the magnetizing mechanism, and
      a yoke including a base portion attached to a second side of the magnet, which is opposite to the first side, and an extension portion extending from the base portion such that an end surface of the extension portion faces a second surface of the sheet-like medium, which is opposite to the first surface;
   a magnetic detection head along the conveyance path and configured to detect magnetism of the magnetized magnetic ink formed on the sheet-like medium; and
   a printing mechanism disposed along the conveyance path and configured to print on the sheet-like medium, wherein
   a first distance between the conveyance path and the first side of the magnet is less than a second distance between the conveyance path and the end surface of the yoke.

10. The printer according to claim 9, wherein the yoke is formed of a soft magnetic material.

11. The printer according to claim 10, wherein the soft magnetic material is electrogalvanized steel.

12. The printer according to claim 10, wherein the soft magnetic material is permalloy.

13. The printer according to claim 9, wherein the base portion is attached directly to the second side of the magnet.

14. The printer according to claim 9, wherein at least a part of the yoke and the magnet is formed of a resin material.

15. The printer according to claim 9, wherein a portion of the extension portion of the yoke faces a side surface of the magnet in a direction that is perpendicular to a conveyance direction of the sheet-like medium.

16. A magnetizing apparatus comprising:
    a conveyance mechanism configured to convey a sheet-like medium along a conveyance path;
    a magnet having a first side arranged to face a first surface of the sheet-like medium that is conveyed along the conveyance path,
    a yoke includes a base portion attached to a second side of the magnet, which is opposite to the first side, and an extension portion extending from the base portion such that an end surface of the extension portion faces a second surface of the sheet-like medium, which is opposite to the first surface, wherein
    a first distance between the conveyance path and the first side of the magnet is less than a second distance between the conveyance path and the end surface of the yoke.

17. The apparatus according to claim 16, wherein the yoke is formed of a soft magnetic material.

18. The apparatus according to claim 16, wherein at least a part of the yoke and the magnet is formed of a resin material.

19. The apparatus according to claim 16, wherein the base portion is attached directly to the second side of the magnet.

20. The apparatus according to claim 16, wherein a portion of the extension portion of the yoke faces a side surface of the magnet in a direction that is perpendicular to a conveyance direction of the sheet-like medium.

* * * * *